United States Patent [19]
Singletery

[11] Patent Number: 5,864,966
[45] Date of Patent: Feb. 2, 1999

[54] TWO SOLVENT VAPOR DRYING TECHNIQUE

[75] Inventor: James Singletery, Glendale, Calif.

[73] Assignee: California Institute of Technology, Pasadena, Calif.

[21] Appl. No.: 995,061

[22] Filed: Dec. 19, 1997

Related U.S. Application Data

[60] Provisional application No. 60/034,275 Dec. 19, 1996.

[51] Int. Cl.⁶ ........................................................ F26B 3/04
[52] U.S. Cl. ................................................ 34/517; 34/78
[58] Field of Search .................................. 34/76, 77, 78, 34/469, 470, 477

[56] References Cited

U.S. PATENT DOCUMENTS

| | | | |
|---|---|---|---|
| 4,841,645 | 6/1989 | Bettcher et al. ........................... | 34/470 |
| 5,369,891 | 12/1994 | Kamikawa ................................. | 34/78 |
| 5,657,553 | 8/1997 | Tarui et al. ............................... | 34/477 |

*Primary Examiner*—Henry A. Bennett
*Assistant Examiner*—Malik N. Drake
*Attorney, Agent, or Firm*—Fish & Richardson P.C.

[57] ABSTRACT

A method for removing moisture and contaminants, at the monolayer level, from the surface of planar and non-planar objects such as semiconductor wafers or corrugated epitaxial layers. The apparatus comprises of two process chambers. Each chamber contains a selected solvent. The interior of each chamber is saturated with the vapors from their respective solvents. The first solvent of the first process chamber has a boiling point much lower than the boiling points of the second solvent in the second process chamber and a rinsing solvent. Vapors from the first solvent displace the rinsing solvent. Vapors from the second solvent displace the first solvent and any other contaminants; the second solvent is then removed resulting in a dry, contaminant free surface.

32 Claims, 2 Drawing Sheets

STEP 1
Heat process chambers until the air inside each is displaced by the respective solvent vapors. This occurs when significant condensation is observed on the pyrex lids. From room temperature, this step takes approximately 30 minutes for acetone and 90 minutes for TCE.

STEP 2
Move sample directly from DI water rinse to process chamber 1. Leave sample in vapors until water is displaced from surface.
This step takes approximately 5 minutes if solvent 1 is acetone. (note: as acetone replaces water on the surface a dynamic kaleidoscopic thin film interference pattern will form)

STEP 3
Move sample quickly from process chamber 1 to process chamber 2. Leave sample in chamber 2 until solvent 1 is displaced from the surface and the sample temperature reaches the vapor temperature of solvent 2. This step takes approximately 5 minutes if solvent 2 is TCE. (note: as solvent 2 displaces solvent 1 the same dynamic kaleidoscopic pattern that appeared in step 2 reappears)

STEP 4
Move sample quickly from process chamber 2 back into process chamber 1. Leave sample in chamber 1 until visible signs of solvent 2 condensation evaporates from both the sample and the sample holder. However, don't leave sample in vapor 1 long enough for condensation of solvent 1 to occur on the surface. If solvent 1 is acetone and solvent 2 is TCE, this step should take between 4 to 5 minutes. Note, as the sample dries in this last step, small static kaleidoscopic patterns will initially form on the surface and then vanish within 3 to 4 minutes. Upon removing the sample after 5 minutes, no additional dry nitrogen blow drying is needed.

*FIG. 2*

TWO SOLVENT VAPOR DRYING TECHNIQUE

This application claims benefit under 35 USC 119(e) of the U.S. Provisional Application No. 60/034,275, filed on Dec. 19, 1996, the entirety of which is incorporated herewith by reference.

ORIGIN OF INVENTION

The invention described herein was made in the performance of work under a NASA contract, and is subject to the provisions of Public Law 96-517 (35 USC 202) in which the Contractor has elected to retain title.

FIELD OF INVENTION

The present invention generally relates to fabrication of semiconductor micro technology and in particular a cleaning technique for cleaning and subsequent drying of planar and non-planar sample substrate surfaces such as wafers or corrugated epitaxial layers at the monolayer level.

BACKGROUND

Sample substrate surfaces such as wafer surfaces are important in determining the quality of the microelectronic fabrication product. Semiconductor substrate crystals, also called boules, are mechanically trimmed to a proper diameter forming a wafer. The wafer is dipped in a chemical etchant to even out any mechanical damage. The wafer also undergoes a series of cleaning steps. These steps remove residual contaminants on the wafer surface. They are of particular interest because the overall device quality may be negatively affected by the presence of trace contaminants.

Epitaxial growth applications demand contaminant-free sample substrate surfaces. A polished bulk grown sample substrate such as a wafer is used as a foundation. A much higher-grade epitaxial layer is grown onto the wafer surface. The new crystal layer has a similar crystal structure to the base wafer. The improved grade is compatible for direct device fabrication. Achieving a chemically pure substrate surface for epitaxial growth is critical to obtaining a high yield from the subsequent fabrication of devices from the epitaxial material.

To ensure a high quality yield, contaminants must be removed from the substrate surface without damaging or undesirably altering the surface. Total metallic impurities on the cleaned surface should be less than $10^{10}$ atoms/cm$^2$; particles greater than 0.1 micrometer in size should be present at less than 0.03 particles /cm$^2$. The desired cleaning protocol should also utilize contamination-free and non-corrosive cleaning agents that are safe and economical for use in batch manufacturing processes.

One major cleaning approach known in the art is wet cleaning. Several types of chemical contaminants, including molecular, ionic, atomic, and gaseous contaminants, can be found on the substrate surface. Wet cleaning techniques use organic solvents for pre-cleaning, the acids within ultrasonic baths to etch away defects, followed by a deionized water rinse, and finally drying. Several effective cleaning agents are described in the literature. Some of these include Hydrofloric acid solutions (e.g. 49 wt % HF), Sulfuric acid—Hydrogen peroxide mixtures (e.g. 98% $H_2SO_4$, 30% $H_2O_2$), and $NH_4OH$, HCl solutions. The acidic and oxidizing solutions selectively form soluble alkali and metal salts by dissolution and or complexing the contaminants. After this reaction, contaminants can then be rinsed away. The surface is dried to remove any residual matter.

Wafer drying is an important step for ensuring that a cleaning process is successful in eliminating contamination. Within the semiconductor industry, a variety of drying techniques have been developed with varying degrees of success. Three such basic methods include: spin drying, Marangoni surface tension drying, and single solvent vapor drying.

Spin drying technique is believed to have some disadvantages. Recontamination can occur from residual impurities on the back side of the sample. In addition, the vacuum apparatus used to secure the wafer while spinning can cause stress-related damage to softer semiconductor materials such as Indium phosphide (InP), Indium arsenide (InAs), or Indium antimonide (InSb).

Another technique, known as Marangoni drying, relies on the change in water/air surface tension as a sample substrate is slowly removed from an alcohol/water solution. The removal speed that results in a dry surface is strongly related to the surface roughness. Hence, for uniform surfaces, such as planar semiconductor substrates, Marangoni drying is a suitable technique. However, for materials with patterned surfaces, Maragoni drying is less effective since it does not provide a means for properly drying all the nonplanar and transition regions.

A third technique, single solvent vapor drying primarily using isopropyl alcohol (IPA), is more effective than spin drying and has recently experienced a great amount of development. Several patents in this area, including U.S. Pat. No. 5,454,390 by Lawson et. al, U.S. Pat. No. 5,371,950 and 5,054,210 by Schumacher, and U.S. Pat. No. 4,777,970 and U.S. Pat. No. 4,736,758 by Kusuhara basically use a two zone process to dry wafers. The first zone consists of an ambient saturated with vapors from a solvent such as isopropyl alcohol (IPA). A sample substrate just removed from a deionized (DI) water rinse cycle is left in the first zone long enough to allow the IPA to displace the DI water from the surface. After a sufficient amount of time, the sample substrate is moved into the second cooler zone. The inventors claim that in the cooler second zone, rapid condensation and gravitational removal of IPA from the surface occurs.

However, during an investigation into the use of single vapor drying technique, the present inventor found that the technique does not sufficiently remove the contaminants. Contaminants present on the substrate surface are revealed during subsequent epitaxial growth. During attempts at epitaxial regrowth on gratings for first order distribute feedback (DFB) lasers, with features as small as 400 angstroms, morphology problems emerged. These morphology problems had a very negative impact on the number of devices fabricated from the material. This low yield is undesirable. The contamination is most likely caused by the presence of droplets of solvent and residue that remain on the surface even after the IPA vapor dry, flash cooling, and high purity $N_2$ blow drying.

In light of the deficiencies encountered in these wafer drying techniques, the final drying step still represents a performance bottleneck in manufacturing lines developed to fabricate deep-sub micron devices. Trace amounts of water vapor and other contamination that remain on the surface of patterned substrates after a thorough chemical cleaning should be removed. Thus, it is desirable to provide a vapor drying system that removes both moisture and cleaning agents from the surface of planar and non-planar sample substrates.

SUMMARY

The present invention provides an apparatus and method for removing moisture and residual matter, at the monolayer level, from the surface of planar and non-planar substrates such as semiconductor wafers or corrugated epitaxial layers. This multi-solvent vapor drying system dries the surface of a substrate by immersing the substrate in a series of vapors from at least two sets of liquid organic solvents until all traces of moisture and solvents are removed from the surface.

The apparatus comprises two individual process chambers equipped with a heating element. Each chamber has a solvent to perform the vapor drying process. In order to initiate the process, the interior of each chamber is saturated with the vapors from their respective solvents. The solvent in each chamber has special characteristics. A first solvent, used in a first process chamber, has specific restrictions placed on its selection. The first solvent is selected to have a boiling point that is much lower than the boiling points of the rinsing solvent (often DI water) and a second solvent. The first solvent is also selected to easily mix with the rinsing solvent (DI water) without resulting in a chemical reaction that would generate rinsing solvent vapor (water vapor). The second solvent of the second process chamber is selected to produce vapors that allow for the removal of the first solvent from the surface of the substrate and simultaneously heat the substrate to a temperature higher than the temperature of the vapors produced by the first process chamber.

After saturating the first and second process chambers with their respective vapors, the drying method is initiated by immersing a freshly rinsed substrate into the first process chamber for a duration of time sufficient to ensure removal of moisture from the substrate. Vapor from the first solvent displaces the rinsing solvent (often DI water) from the surface. Next, the substrate is placed in the second process chamber for a duration of time sufficient to remove any trace of the first solvent from the substrate and to heat the substrate to the vapor temperature of the second process chamber. Finally, the substrate is dried by quickly returning the heated substrate to the first process chamber so that the second solvent is removed from the substrate by non-equilibrium evaporation without condensation of the first solvent on the substrate occurring. This three part vapor drying scheme provides an extremely dry surface for epitaxial regrowth on patterned surfaces. This process seems to leave no apparent residue, on a nearly defect-free surface.

A preferred embodiment of this multi-solvent vapor drying system utilizes acetone (ACE) and trichloroethylene (TCE). ACE is used as the first solvent and TCE is used as the second solvent; when these solvents are utilized in our three part vapor drying scheme, this combination is referred to as ACE/TCE/ACE (ATA) combination. Isopropyl alcohol (IPA) may also be used as the second solvent; this is referred to as the ACE/IPA/ACE (AIA) combination.

The present invention provides numerous advantages to the vapor drying technology. When compared with prior art such as spin drying, the present invention allows a strain free drying technique. The previous single solvent vapor dry system features a final $N_2$ drying step. The present invention does not require $N_2$ drying. Our multi-solvent vapor drying system removes water vapor and drying agents from the surface of a substrate to a greater extent than the prior arts.

The present invention features an inexpensive apparatus that dries the sample substrate in a particle and moisture free environment. The invention is suitable for industry applications. It can be easily modified to handle substrates that vary in number and size and can be easily incorporated into existing manufacturing equipment.

BRIEF DESCRIPTION OF THE DRAWING

FIG. 2 is a block diagram of a multi-solvent vapor drying protocol.

DESCRIPTION OF THE PREFERRED EMBODIMENTS

Multi-solvent valpor drying apparatus

Figure 1:
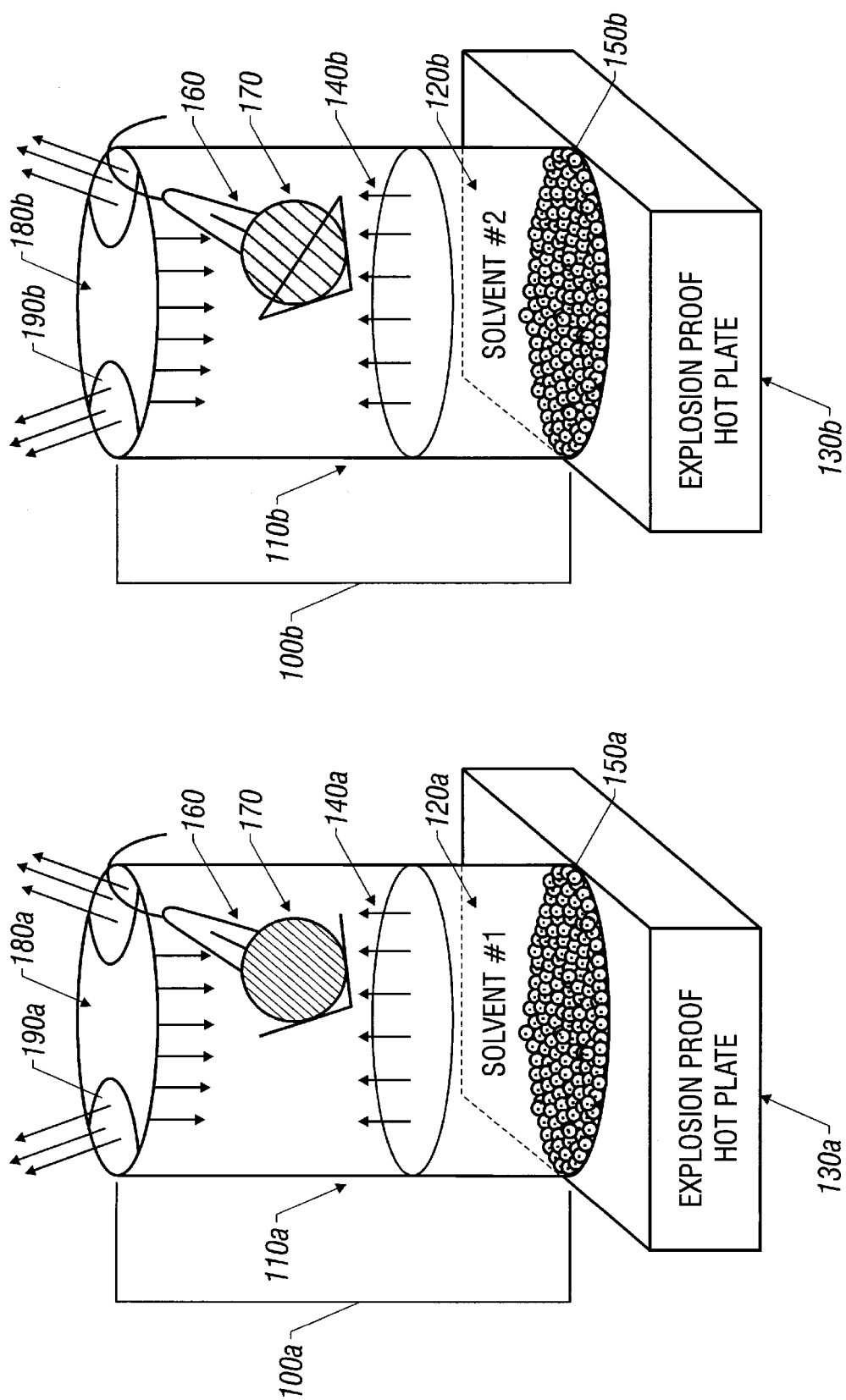
FIG. 1 is a schematic illustrating a multi-solvent vapor drying apparatus.

The drying apparatus has two process chambers each containing a selected solvent; a means of vaporizing solvents in each individual process chamber; a means for securing and transferring a sample substrate from one process chamber tc) another; and a means to allow partial venting of the vapors.

In one preferred embodiment as shown in FIG. 1, the drying apparatus has a first process chamber, 100a and a second process chamber, 100b. The first process chamber, 100a is formed within a PYREX(TM) beaker 100a, used to contain the first solvent 120a. The first solvent 120a is heated by an explosion proof hot plate 130a to generate a first vapor 140a. The explosion proof hot plate 130a has all of its electrical circuitry enclosed in a metal casing. This metal casing prevents any volatile vapor from seeping into the hot plate circuitry where the vapor could be ignited. The explosion proof hot plate 130a is positioned to be in contact with a surface of the first process chamber 100a.

TEFLON(TM) boiling stones 150a are positioned to cover the surface of the process chamber in contact with the hot plate 130a. TEFLON(TM) boiling stones 150a are used to prevent superheating of the first solvent 120a. A sample holder 160 with a sample 170 is positioned inside the first process chamber 100a. The sample holder 160 suspends the sample 170 above the liquid first solvent 120a, while allowing the sample 170 to be exposed to the first vapor 140a. The sample holder 160 provides a means to transport the sample 170 from one chamber to the other. The process chamber also has a PYREX(TM) lid 180a, positioned to form a surface opposed to the surface that is in contact with the hot plate 130a. The lid 180a has vent slots 190a and is used to contain, recirculate, and partially vent the vapors 140a.

The second process chamber, 100b is a similar apparatus having: PYREX(TM) beaker 110b, second solvent 120b, explosion proof hot plate 130b, second vapor 140b, TEFLON(TM) boiling stones 150b, sample holder 160, sample 170, PYREX(TM) lid 180b, and vent slots 190b.

A single sample holder 160 and one sample 170 is used for both of the two process chambers 100a and 100b. The sample holder 160 and sample 170 is transferred from one chamber to the other.

Solvent selection

The first and second solvents are selected based on their vaporization/condensation characteristics. In the preferred embodiment, the sample substrate is wet cleaned and rinsed in deionized (DI) water before the drying process begins. Hence, the first solvent is chosen to have a boiling point much lower than that of the rinsing solvent (DI water, boiling point 100° C.) so that the first solvent vapors could displace the DI water from the substrate surface. The first solvent must also mix with DI water without resulting in a reaction that would generate water vapor. The second solvent is selected to produce vapors that allow for removal of the first solvent from the substrate surface and simultaneously heat the substrate to a temperature higher than the temperature of the vapors produced by the first process chamber.

The preferred first solvent in the first process chamber is acetone (ACE). ACE has a boiling point of 56.2° C. The second solvent is trichloroethylene (TCE) with a boiling point of 86.9° C.

The ACE/TCE/ACE (ATA) combination was chosen because TCE could remove any organic residual that would assist in keeping water vapor on the surface. However, since water does not dissolve easily in TCE, the initial ACE vapor treatment is used to remove as much water vapor from the sample surface between immersing the sample in TCE. Furthermore, since ACE easily mixes with TCE and is more volatile, ACE was used as a final vapor treatment to remove TCE from the surface.

Another embodiment would replace TCE with a more environmentally friendly solvent such as Isopropyl alcohol (IPA). The ACE/IPA/ACE (AIA) combination is another effective combination. Although IPA has a slightly lower boiling point than TCE (82.5° vs. 86.9° C.), IPA still functions effectively as the second solvent.

Other solvent selections that have similar boiling point and solubility characteristics could also be used and is anticipated by the present inventors.

Process Description

FIG. 2 describes the processing steps for the preferred method of this invention. Step 1 Saturation of Chambers: describe how to prepare the chambers for the drying process. Step 2 Displacement of Rinse Solvent by First Solvent: describes how DI water is removed from the sample surface. Step 3 Displacement of First Solvent by Second Solvent: describes how the first solvent used to remove water from the surface is removed from the sample. Step 4 Removal of Second Solvent: describe how the second solvent is removed from the surface without leaving a residue.

Step 1: Saturation of Chambers

An initial part of the process establishes the proper particle- and moisture-free atmospheres for vapor drying. The process begins by heating the first and second process chambers, parts 100*a* and 100*b* in FIG. 1, to the point where their interiors are saturated with their respective vapors. Since these parts have different solvents, they have different boiling points and hence need different amounts of heat. The saturation process is easily observed once the first and second solvents 120*a* and 122*b* begin boiling. As each solvent begins to boil, a first and second vapor 140*a*, 140*b* cloud forms, just above the boiling solvent, that condenses on the side wall of the beakers 110*a* and 110*b*. As time progresses, the condensation level begins to climb the walls of the chamber, signifying that room air is being displaced from the chamber. The process of displacing the air from the chamber is complete when condensation begins to form on the PYREX(TM) lids, 180*a* and 180*b*.

For the embodiment illustrated in FIG.1, the saturation of the first process chamber (non-pressurized chamber), 100*a*, occurs within 30 minutes if ACE is used as the first solvent. The saturation of the second process chamber (non-pressurized), 100*b*, occurs within 90 minutes if TCE is used as the second solvent. If IPA is used as the second solvent, the saturation of the second chamber occurs in less than 90 minutes. IPA saturation occurs in less time as compared with TCE because IPA has a slightly lower boiling point than that of TCE. Once the saturation process is completed for both chambers, the second phase of the drying process can begin.

Step 2: Displacement of Rinse Solvent by First Solvent

The second step is to displace DI water from the surface of the sample. The sample substrate 170 is removed from the DI water rinse and then the substrate is vertically immersed into the first vapors 140*a* above the first solvent by the sample holder, 160. The samples are vertically immersed to facilitate condensation of vapors from the first solvent onto the sample surface. Vertical immersion helps to reduce contamination.

With time, the DI water on the surface mixes with the vapors of the first solvent that condense on the sample. The solvent/DI water mixture on the surface eventually slides off of the sample surface due to the mixture's reduced surface tension and the influence of gravity. As DI water is removed from the surface and replaced by a thin film of the first solvent, a pattern, called herein, a dynamic kaleidoscopic pattern, is observed. This pattern reflects the presence of a very thin (e.g., several tens of nanometers thick) but uneven film of solvent covering the surface. To ensure that water is totally displaced from the surface, the sample is left in the vapors for 5 minutes even though a shorter immersion time may be possible.

During the 5 minute exposure, recirculation of water vapor onto the surface does not occur for two reasons. First, the first solvent is chosen to have a boiling point much lower than water. If ACE is used as the first solvent, its boiling point of 56.2° C. is much lower than the 100° C. temperature for water, hence very little water should be present in the vapor phase. Second, since ACE and water form a non-azeotropic mixture, that is the composition of the mixture does change upon distillation, any water trapped in the boiling ACE should stay in solution, much like in fractional distillation process. Even though water is removed from the sample surface as a result of this step, a thin film of the first solvent still remains on the surface, which the next step of the process is designed to eliminate.

Step 3: Displacement of First Solvent by Second Solvent

In addition to removing the first solvent from the surface of the sample, the third step of the process is also designed to heat the sample to a temperature greater than the vapor temperature of the first process chamber. This step starts by quickly removing the sample from the first process chamber, and vertically immersing the sample in the second vapors 140*b* generated by the second solvent. As the thin film of the first solvent is removed form the sample surface, the same dynamic kaleidoscopic pattern observed in step 2 reappears, once acain signaling the formation of an uneven thin film of solvent. However, the displacement process is slightly different in this case. Since both the boiling second solvent and the sample surface are at temperatures greater than the boiling point of the first solvent, the first solvent is removed primarily by evaporation. If TCE is used as the second solvent and ACE as the first solvent, ACE is displaced from the surface and the sample surface temperatures stabilizes at 85.5° C. within 5 minutes. If IPA is used as the second solvent, the temperatures stabilizes at around 81° C. within 5 minutes.

Although this step succeeds in removing the first solvent from the surface, nonetheless, trace amounts of the second solvent still remains on the surface. However, as a result of this step, the sample is now in a state such that all drying agents can be quickly removed.

Step 4: Removal of Second Solvent

The final step of this method is designed to complete the drying process without leaving any residue. The heated sample is quickly removed from the second process chamber and vertically re-immersed in the vapors 140*a* of the first process chamber. Almost immediately droplets of the second solvent form on the surface of the sample holder and small static kaleidoscopic patterns form on the surface of the sample reflecting trace amounts of the second solvent on the surface. However, since the sample is temporarily at a temperature above the vapor temperature of the first solvent, the dynamic kaleidoscopic pattern indicative of the first solvent condensing on the surface never forms. Instead, the droplets observed on the sample holder and the patterns observed on the sample surface begin to disappear; once this process of evaporation is complete, the sample is dry and ready for removal.

Upon removal, the extreme dryness of the sample is readily apparent since no sign of condensation exist not only on the sample but also on the sample holder and within the grooves of the holder that are used to support the sample.

The critical feature of this last step that results in such extreme dryness is a "window of dryness". This window is defined by the amount of time the sample remains at an elevated temperature versus the time it takes the second solvent to evaporate from the surface. For as the temperature of the sample approaches the vapor temperature of the first solvent, droplets of the first solvent will condense on the surface thus re-contaminating the surface. Using ACE as the first solvent and TCE as the second solvent, the window of dryness is from 4 to 8 minutes since signs of TCE contamination disappear between 3 to 4 minutes after immersion (possibly aided by the solubility of TCE in ACE), and ACE condensation is observed on the surface after 8 minutes of immersion. Therefore a 5 minute drying time was chosen to ensure elimination of TCE without ACE condensing on the surface.

Although IPA has slightly lower boiling point than TCE (82.5° vs. 86.9° C.), the sample temperature after step 3 of the method would still be high enough to permit a 5 minute immersion time in step 4 of the method.

Other embodiments

Another embodiment involve enclosing the second solvent in a pressurized chamber in order to raise the second solvent vapor temperature. The surface temperature of the sample during step 3 is raised by raising the second solvent's vapor temperature. Increasing the sample surface temperature will increase the evaporation rate of the second solvent during step 4 which, in turn, would cause the visible signs of the second solvent condensation to vanish more quickly than the existing 3–4 minute time period. The increase surface temperature also provides the user the option of longer immersion time. Longer immersion time during step 4 is possible because it would take a longer time for the sample to cool to a temperature where condensation from the first solvent would appear on the surface.

For example, if IPA is used as the second solvent, a pressurized second process chamber could increase the surface temperature of the sample surface at step 3. The vapor temperature of the second process chamber could be raised to match the temperature achieved during a TCE immersion by enclosing the IPA solvent in a chamber pressurized to only 0.2 psi above atmosphere.

Yet another embodiment would employ an improved explosion proof heater to permit quicker saturation of the first and second process chambers during step one of this method.

Hence, the time duration ranges disclosed are not absolute and can be easily modified by changing pressure and rate of heating. The important concept in regards to time is to allow a duration that is sufficient to achieve a certain process in each of the disclosed steps.

Additional monitoring devices may be incorporated into the drying apparatus. A thermocouple could be used to electronically monitor the sample surface temperatures and the process chamber temperatures. Thermocouple provides a feedback control means for the drying apparatus.

Another embodiment features the entire drying apparatus enclosed in a Nitrogen gas atmosphere. The ambient air is pumped out and replaced by Nitrogen gas. This may reduce contamination as the sample is transferred from one process chamber to the other.

The transfer of the sample holder from one process chamber to the other may be achieved manually. Another embodiment may utilize robotic arms or other automated means to lift the sample holder from the first process chamber, move the sample holder to the second process chamber, and place the sample holder into the second process chamber.

A vapor recovery system may be incorporated to collect vapor from the vent slots so that solvent may be recondensed and recycled back into the drying apparatus.

Other alternative materials for constructing the drying apparatus are also anticipated by the present inventors. A stainless steel process chamber could be used in lieu of PYREX(TM) beakers. TEFLON(TM) sample holder could be used. The material used for the process chamber may be any material that effectively contains the solvent and isolates the vapors of the solvent within the process chamber walls. It is desired that the materials used to form the drying apparatus will not chemically react with the solvent and vapors to form additional contaminants.

Description of Test Results for ATA Vapor Dry

To confirm that the multi-solvent ATA drying process leaves no contamination on the surface, x-ray photoelectron spectroscopy (XPS) analysis was performed on a test sample before and after an extensive sample preparation, which included the ATA vapor drying technique, was performed on a planar surface. A measurable decrease in carbon and oxygen contamination was observed. The remaining amounts of carbon and oxygen were most likely caused by exposing the sample to air during transport to the XPS system.

The monolevel dryness of the surface has been further confirmed by immediately performing demanding thin film epitaxial growth on both planar substrates and corrugated gratings used to produce DFB lasers without using the standard $N_2$ blow drying prior to loading. The growth on a planar 2-inch diameter wafer emerged from the reactor with very few surface defects. After growth, the surface appeared planar to the naked eye. However, under Nomarski magnification, the grating area, and cleaved lines reappeared with near perfect coverage of the surface. Clean smooth boundaries exists among the grating area, cleave lines and planar region. DFB laser fabricated from material grown on corrugated gratings exhibited very good reliability and state-of-the-art performance.

To highlight the superior performance of the multi-solvent ATA drying technique over the single solvent IPA drying technique, a comparison of the surface morphology after regrowth was also performed. To eliminate any affects caused by unintentional variations in growth parameters, both samples were placed in the growth chamber at the same time. The surface using single solvent IPA vapor dry showed the presence of numerous bubble-like defects. The surface using ATA vapor dry was nearly defect-free.

Similar results were obtained from using ACE/IPA/ACE solvent combinations.

The exact theoretical explanation for our superior performance drying technique is still not complete. The higher boiling temperature of the second solvent as compared to the first solvent may be a partial reason for this phenomenon. The higher temperature second solvent bath could heat the sample to a high enough temperature to prevent any first solvent from condensing on the surface during the final first solvent vapor dip.

However, results from one particular test using ACE/TCE/ACE, cast doubt that sample heating alone is responsible for the drying phenomenon. The test entailed leaving the sample in the final ACE dip long enough to cool to the temperature of the ACE vapor, at which point a large amount of condensation should reappear on the sample surface. However, after twenty minutes of exposure in the final vapor dry, a smaller than expected amount of additional condensation was observed on the surface. Hence, a much more complicated drying phenomenon is occurring that will require additional research to solve.

The present inventor believe that the two solvent vapor drying process works because of the non-equilibrium evaporation of solvents. Analysis of this method with other diagnostic equipment unavailable at present might reveal other phenomena that are also important to this drying process.

The two solvent vapor drying technique is a simple ana elegant method for drying both planar and non-planar surfaces. The apparatus used to employ the vapor drying method is simple in its construction thus enabling its easy incorporation into existing vapor drying equipment.

What is claimed is:

1. A method for drying a sample substrate comprising:
   first heating a first process chamber, said first process chamber containing a first solvent, said first heating being sufficient to produce a first vapor saturating said first process chamber;
   second heating a second process chamber, said second process chamber containing a second solvent, said second heating being sufficient to produce a second vapor saturating said second process chamber;
   first immersing a sample into the first vapor in the first process chamber during said saturating, wherein the first vapor functions to displace any other solvents from a surface of the sample while leaving a layer of the first solvent on the surface of the sample;
   removing the sample from the first vapor;
   second immersing the sample into the second vapor in the second process chamber during said saturating, wherein the second vapor functions to displace the layer of first solvent from the surface of the sample while leaving a layer of the second solvent on the surface of the sample;
   removing the sample from the second vapor; and
   third immersing the sample back into the first vapor, the first vapor functions to remove the layer of second solvent from the surface of the sample without redepositing the first solvent onto the surface, producing a contamination-free surface.

2. A method as in claim 1, wherein the first solvent is acetone.

3. A method as in claim 1, wherein the second solvent is trichloroethylene.

4. A method as in claim 1, wherein the second solvent is isopropyl alcohol.

5. A method as in claim 1, wherein said any other solvents include a rinsing solvent.

6. A method as in claim 5, wherein the rinsing solvent is deionized water.

7. A method as in claim 2, wherein the saturation occurs within 30 minutes.

8. A method as in claim 3, wherein the saturation occurs within 90 minutes.

9. A method as in claim 4, wherein the saturation occurs in less than 90 minutes.

10. A method as in claim 1, wherein the first solvent is acetone and the second solvent is trichloroethylene.

11. A method as in claim 1, wherein the first solvent is acetone and the second solvent is isopropyl alcohol.

12. A method as in claim 5, wherein the first immersion occurs for a duration sufficient for the rinsing solvent to be completely displaced from the sample surface.

13. A method as in claim 1, wherein the second immersing occurs for a duration sufficient for the first solvent to be displaced by the second solvent.

14. A method as in claim 1, wherein the third immersing occurs for a duration that removes all of the second solvent from the sample surface.

15. A method as in claim 10, wherein the first immersion, the second immersion, and the third immersion each occurs for 5 minutes.

16. A method as in claim 11, wherein the first immersion, the second immersion, and the third immersion each occurs for 5 minutes.

17. A method as in claim 1, wherein the first and second process chambers are pressurized.

18. A method as in claim 17, wherein the first solvent is acetone and the second solvent is trichloroethylene.

19. A method as in claim 17, wherein the first solvent is acetone and the second solvent is isopropyl alcohol.

20. A method as in claim 18, wherein the first immersing, the second immersing, and the third immersing each occurs in less than 5 minutes.

21. A method as in claim 19, wherein the first immersing, the second immersing, and the third immersing each occurs in less than 5 minutes.

22. A method as in claim 5, wherein the first solvent has a boiling point wherein the boiling point is much lower than a boiling point of the rinsing solvent.

23. A method as in claim 5, wherein the first solvent has a characteristic that enables the first solvent to mix with the rinsing solvent without resulting in a vaporization reaction of the rinsing solvent.

24. A method as in claim 5, wherein the first solvent and the rinsing solvent forms a non-azeotropic mixture.

25. A method as in claim 1, wherein the second solvent has a boiling point that is lower than the boiling point of the rinsing solvent and is higher than the boiling point of the first solvent.

26. A method as in claim 1, wherein the second solvent heat the sample to a temperature higher than the temperature of the first vapor produced by the first process chamber.

27. A method for drying a sample substrate comprising:
   first heating a first process chamber, said first process chamber containing a first solvent, said first heating being sufficient to produce a first vapor saturating said first process chamber;
   second heating a second process chamber, said second process chamber containing a second solvent, said second heating being sufficient to produce a second vapor saturating said second process chamber;
   first immersing a sample into the first vapor in the first process chamber during said saturating, wherein the first immersion occurs for a duration sufficient for any other solvent to be displaced from a surface of the sample by said first solvent, said duration is signaled by detecting the presence of a dynamic kaleidoscopic pattern on the surface of the sample;

removing the sample from the first vapor;

second immersing the sample into the second vapor in the second process chamber during said saturating, wherein the second immersing occurs for a duration sufficient for the first solvent to be displaced by the second solvent, said duration is signaled by detecting the presence of a dynamic kaleidoscopic pattern on the surface of the sample;

removing the sample from the second vapor; and evaporating the second solvent from the surface of the sample, producing a contamination-free surface.

28. A method as in claim 27, wherein the first solvent is acetone.

29. A method as in claim 27, wherein the second solvent is trichloroethylene.

30. A method as in claim 27, wherein the second solvent is isopropyl alcohol.

31. A method as in claim 27, wherein said any other solvents include a rinsing solvent.

32. A method as in claim 31, wherein the rinsing solvent is deionized water.

* * * * *